United States Patent
Sato et al.

(10) Patent No.: US 8,179,414 B2
(45) Date of Patent: May 15, 2012

(54) SURFACE-EMITTING LASER ARRAY, OPTICAL SCANNING DEVICE, AND IMAGE FORMING DEVICE

(75) Inventors: Shunichi Sato, Miyagi (JP); Yoshinori Hayashi, Kanagawa (JP); Daisuke Ichii, Kanagawa (JP)

(73) Assignee: Ricoh Company, Ltd., Tokyo (JP)

( * ) Notice: Subject to any disclaimer, the term of this patent is extended or adjusted under 35 U.S.C. 154(b) by 599 days.

(21) Appl. No.: 12/377,284

(22) PCT Filed: Jul. 4, 2008

(86) PCT No.: PCT/JP2008/062529
§ 371 (c)(1),
(2), (4) Date: Feb. 12, 2009

(87) PCT Pub. No.: WO2009/011290
PCT Pub. Date: Jan. 22, 2009

(65) Prior Publication Data
US 2010/0214633 A1 Aug. 26, 2010

(30) Foreign Application Priority Data

Jul. 13, 2007 (JP) ................................. 2007-184190
Apr. 17, 2008 (JP) ................................. 2008-107363

(51) Int. Cl.
*B41J 2/45* (2006.01)
(52) U.S. Cl. ....................................................... 347/238
(58) Field of Classification Search .......... 347/231–233, 347/238, 241–244, 256–261
See application file for complete search history.

(56) References Cited

U.S. PATENT DOCUMENTS

| 6,101,018 | A | * | 8/2000 | Naiki et al. ................ 359/204.1 |
| 6,144,685 | A | | 11/2000 | Iwasa et al. |
| 6,462,853 | B2 | | 10/2002 | Hayashi |
| 6,614,821 | B1 | | 9/2003 | Jikutani et al. |
| 6,674,785 | B2 | | 1/2004 | Sato et al. |
| 6,765,232 | B2 | | 7/2004 | Takahashi et al. |
| 6,788,444 | B2 | | 9/2004 | Suzuki et al. |
| 6,803,604 | B2 | | 10/2004 | Takahashi et al. |

(Continued)

FOREIGN PATENT DOCUMENTS

JP 59175174 A * 10/1984

(Continued)

OTHER PUBLICATIONS

May 13, 2011 European search report in connection with counterpart European patent application No. 08 77 8050.

(Continued)

*Primary Examiner* — Hai C Pham
(74) *Attorney, Agent, or Firm* — Cooper & Dunham LLP

(57) ABSTRACT

A surface-emitting laser array includes a plurality of light emitting parts arranged in a two-dimensional formation having two orthogonal directions. When the plurality of light emitting parts are orthogonally projected on a virtual line parallel to one of the two orthogonal directions, a spacing between two of the plurality of light emitting parts along the virtual line is equal to an integral multiple of a predetermined value. The plurality of light emitting parts include a first light emitting part, a second light emitting part adjacent to the first light emitting part, and a third light emitting part adjacent to the second light emitting part, and a spacing between the first and second light emitting parts differs from a spacing between the second and third light emitting parts.

13 Claims, 20 Drawing Sheets

U.S. PATENT DOCUMENTS

| | | | |
|---|---|---|---|
| 6,927,412 B2 | 8/2005 | Takahashi et al. | |
| 6,959,025 B2 | 10/2005 | Jikutani et al. | |
| 6,975,663 B2 | 12/2005 | Sekiya et al. | |
| 7,068,296 B2 | 6/2006 | Hayashi et al. | |
| 7,106,483 B2 | 9/2006 | Hayashi et al. | |
| 7,218,432 B2 | 5/2007 | Ichii et al. | |
| 7,253,937 B2 | 8/2007 | Ueda et al. | |
| 7,271,823 B2 | 9/2007 | Izumi et al. | |
| 7,271,824 B2 | 9/2007 | Omori et al. | |
| 7,362,486 B2 | 4/2008 | Hayashi et al. | |
| 2003/0174753 A1 | 9/2003 | Yabuki et al. | |
| 2006/0232659 A1 | 10/2006 | Hayashi et al. | |
| 2006/0245009 A1 | 11/2006 | Akiyama et al. | |
| 2006/0284968 A1 | 12/2006 | Hayashi et al. | |
| 2006/0285187 A1 | 12/2006 | Ichii et al. | |
| 2007/0013765 A1* | 1/2007 | Hudson et al. | 347/238 |
| 2007/0058255 A1 | 3/2007 | Imai et al. | |
| 2007/0211324 A1 | 9/2007 | Sakai et al. | |
| 2007/0211325 A1 | 9/2007 | Ichii | |
| 2007/0253047 A1 | 11/2007 | Ichii et al. | |
| 2007/0253048 A1 | 11/2007 | Sakai et al. | |
| 2007/0280322 A1 | 12/2007 | Sato et al. | |
| 2007/0297036 A1 | 12/2007 | Nakamura et al. | |
| 2008/0024849 A1 | 1/2008 | Hayashi et al. | |
| 2008/0025759 A1 | 1/2008 | Ichii et al. | |
| 2008/0055672 A1 | 3/2008 | Watanabe et al. | |
| 2008/0055690 A1 | 3/2008 | Nakamura et al. | |
| 2008/0055692 A1 | 3/2008 | Saisho et al. | |
| 2008/0056321 A1 | 3/2008 | Motomura et al. | |
| 2008/0068689 A1 | 3/2008 | Saisho et al. | |
| 2008/0068690 A1 | 3/2008 | Ichii | |
| 2008/0068693 A1 | 3/2008 | Hayashi et al. | |
| 2010/0060712 A1 | 3/2010 | Sato et al. | |

FOREIGN PATENT DOCUMENTS

| | | |
|---|---|---|
| JP | 1-45065 | 10/1989 |
| JP | 6-48846 | 6/1994 |
| JP | 11-340570 | 12/1999 |
| JP | 11-354888 | 12/1999 |
| JP | 2001-272615 | 10/2001 |
| JP | 2001-358411 | 12/2001 |
| JP | 2002-347270 | 12/2002 |
| JP | 2005-234510 | 9/2005 |
| JP | 2005-274755 | 10/2005 |
| JP | 2006-215270 | 8/2006 |
| WO | WO2007/126159 A1 | 11/2007 |

OTHER PUBLICATIONS

Jul. 8, 2010 Chinese office action in connection with counterpart Chinese patent application.

* cited by examiner

FIG.6

| MAIN SCAN # n-1 | MAIN SCAN # n | MAIN SCAN # n+1 | | MAIN SCAN # n-1 | MAIN SCAN # n | MAIN SCAN # n+1 |
|---|---|---|---|---|---|---|
|  |  |  |  |  |  | ch11 |
|  | ch1 |  |  |  | ch31 |  |
| ch21 |  |  |  |  |  | ch12 |
|  | ch2 |  |  |  | ch32 |  |
| ch22 |  |  |  |  |  | ch13 |
|  | ch3 |  |  |  | ch33 |  |
| ch23 |  |  |  |  |  | ch14 |
|  | ch4 |  |  |  | ch34 |  |
| ch24 |  |  |  |  |  | ch15 |
|  | ch5 |  |  |  | ch35 |  |
| ch25 |  |  |  |  |  | ch16 |
|  | ch6 |  |  |  | ch36 |  |
| ch26 |  |  |  |  |  | ch17 |
|  | ch7 |  |  |  | ch37 |  |
| ch27 |  |  |  |  |  | ch18 |
|  | ch8 |  |  |  | ch38 |  |
| ch28 |  |  |  |  |  | ch19 |
|  | ch9 |  |  |  | ch39 |  |
| ch29 |  |  |  |  |  | ch20 |
|  | ch10 |  |  |  | ch40 |  |
| ch30 |  |  |  |  |  | ch21 |
|  | ch11 |  |  |  |  | ch22 |
| ch31 |  |  |  |  |  | ch23 |
|  | ch12 |  |  |  |  | ch24 |
| ch32 |  |  |  |  |  | ch25 |
|  | ch13 |  |  |  |  | ch26 |
| ch33 |  |  |  |  |  | ch27 |
|  | ch14 |  |  |  |  | ch28 |
| ch34 |  |  |  |  |  | ch29 |
|  | ch15 |  |  |  |  | ch30 |
| ch35 |  |  |  |  |  | ch31 |
|  | ch16 |  |  |  |  | ch32 |
| ch36 |  |  |  |  |  | ch33 |
|  | ch17 |  |  |  |  | ch34 |
| ch37 |  |  |  |  |  | ch35 |
|  | ch18 |  |  |  |  | ch36 |
| ch38 |  |  |  |  |  | ch37 |
|  | ch19 |  |  |  |  | ch38 |
| ch39 |  |  |  |  |  | ch39 |
|  | ch20 |  |  |  |  | ch40 |
| ch40 |  |  |  |  |  |  |
|  |  | ch1 |  |  |  |  |
|  | ch21 |  |  |  |  |  |
|  |  | ch2 |  |  |  |  |
|  | ch22 |  |  |  |  |  |
|  |  | ch3 |  |  |  |  |
|  | ch23 |  |  |  |  |  |
|  |  | ch4 |  |  |  |  |
|  | ch24 |  |  |  |  |  |
|  |  | ch5 |  |  |  |  |
|  | ch25 |  |  |  |  |  |
|  |  | ch6 |  |  |  |  |
|  | ch26 |  |  |  |  |  |
|  |  | ch7 |  |  |  |  |
|  | ch27 |  |  |  |  |  |
|  |  | ch8 |  |  |  |  |
|  | ch28 |  |  |  |  |  |
|  |  | ch9 |  |  |  |  |
|  | ch29 |  |  |  |  |  |
|  |  | ch10 |  |  |  |  |
|  | ch30 |  |  |  |  |  |

FIG.9

| | MAIN SCANS | | |
|---|---|---|---|
| 1ST SCAN | 2ND SCAN | 3RD SCAN | 4TH SCAN |
| | ch1 | | |
| ch5 | | | |
| | ch2 | | |
| ch6 | | | |
| | ch3 | | |
| ch7 | | | |
| | ch4 | | |
| ch8 | | | |
| | ch5 | | |
| | | ch1 | |
| | ch6 | | |
| | | ch2 | |
| | ch7 | | |
| | | ch3 | |
| | ch8 | | |
| | | ch4 | |
| | | | ch1 |
| | | ch5 | |
| | | | ch2 |
| | | ch6 | |
| | | | ch3 |
| | | ch7 | |
| | | | ch4 |
| | | ch8 | |
| | | | ch5 |
| | | | |
| | | | ch6 |
| | | | |
| | | | ch7 |
| | | | |
| | | | ch8 |

FIG.10

| | MAIN SCANS | | |
|---|---|---|---|
| 1ST SCAN | 2ND SCAN | 3RD SCAN | 4TH SCAN |
| | ch1 | | |
| ch5 | | | |
| | ch2 | | |
| ch6 | | | |
| | ch3 | | |
| ch7 | | | |
| | ch4 | | |
| | | ch1 | |
| | ch5 | | |
| | | ch2 | |
| | ch6 | | |
| | | ch3 | |
| | ch7 | | |
| | | ch4 | |
| | | | ch1 |
| | | ch5 | |
| | | | ch2 |
| | | ch6 | |
| | | | ch3 |
| | | ch7 | |
| | | | ch4 |
| | | | |
| | | | ch5 |
| | | | |
| | | | ch6 |
| | | | |
| | | | ch7 |

FIG.11

| MAIN SCANS | | | |
|---|---|---|---|
| 1ST SCAN | 2ND SCAN | 3RD SCAN | 4TH SCAN |
|  | ch1 |  |  |
| ch5 |  |  |  |
|  | ch2 |  |  |
| ch6 |  |  |  |
|  | ch3 |  |  |
| ch7 |  |  |  |
|  | ch4 |  |  |
| ch8 |  |  |  |
|  |  | ch1 |  |
|  | ch5 |  |  |
|  |  | ch2 |  |
|  | ch6 |  |  |
|  |  | ch3 |  |
|  | ch7 |  |  |
|  |  | ch4 |  |
|  | ch8 |  |  |
|  |  |  | ch1 |
|  |  | ch5 |  |
|  |  |  | ch2 |
|  |  | ch6 |  |
|  |  |  | ch3 |
|  |  | ch7 |  |
|  |  |  | ch4 |
|  |  | ch8 |  |
|  |  |  |  |
|  |  |  | ch5 |
|  |  |  |  |
|  |  |  | ch6 |
|  |  |  |  |
|  |  |  | ch7 |
|  |  |  |  |
|  |  |  | ch8 |

FIG.12

| MAIN SCANS | | | |
|---|---|---|---|
| 1ST SCAN | 2ND SCAN | 3RD SCAN | 4TH SCAN |
|  | ch1 |  |  |
| ch5 |  |  |  |
|  | ch2 |  |  |
| ch6 |  |  |  |
|  | ch3 |  |  |
| ch7 |  |  |  |
|  | ch4 |  |  |
|  |  |  |  |
|  |  | ch1 |  |
|  | ch5 |  |  |
|  |  | ch2 |  |
|  | ch6 |  |  |
|  |  | ch3 |  |
|  | ch7 |  |  |
|  |  | ch4 |  |
|  |  |  |  |
|  |  |  | ch1 |
|  |  | ch5 |  |
|  |  |  | ch2 |
|  |  | ch6 |  |
|  |  |  | ch3 |
|  |  | ch7 |  |
|  |  |  | ch4 |
|  |  |  |  |
|  |  |  |  |
|  |  |  | ch5 |
|  |  |  |  |
|  |  |  | ch6 |
|  |  |  |  |
|  |  |  | ch7 |

FIG.14

| MAIN SCAN # n-1 | MAIN SCAN # n | MAIN SCAN # n+1 |
|---|---|---|
|  | ch1 |  |
|  | ch2 |  |
|  | ch3 |  |
| ch21 |  |  |
|  | ch4 |  |
|  | ch5 |  |
|  | ch6 |  |
| ch22 |  |  |
|  | ch7 |  |
|  | ch8 |  |
|  | ch9 |  |
| ch23 |  |  |
|  | ch10 |  |
|  | ch11 |  |
| ch24 |  |  |
|  | ch12 |  |
|  | ch13 |  |
|  | ch14 |  |
|  | ch15 |  |
| ch25 |  |  |
|  | ch16 |  |
| ch26 |  |  |
| ch27 |  |  |
| ch28 |  |  |
| ch29 |  |  |
|  | ch17 |  |
| ch30 |  |  |
| ch31 |  |  |
|  | ch18 |  |
| ch32 |  |  |
| ch33 |  |  |
| ch34 |  |  |
|  | ch19 |  |
| ch35 |  |  |
| ch36 |  |  |
| ch37 |  |  |
|  | ch20 |  |
| ch38 |  |  |
| ch39 |  |  |
| ch40 |  |  |
|  |  | ch1 |
|  |  | ch2 |
|  |  | ch3 |
|  | ch21 |  |
|  |  | ch4 |
|  |  | ch5 |
|  |  | ch6 |
|  | ch22 |  |
|  |  | ch7 |
|  |  | ch8 |
|  |  | ch9 |
|  | ch23 |  |
|  |  | ch10 |
|  |  | ch11 |
|  | ch24 |  |
|  |  | ch12 |
|  |  | ch13 |
|  |  | ch14 |
|  |  | ch15 |
|  | ch25 |  |

| MAIN SCAN # n-1 | MAIN SCAN # n | MAIN SCAN # n+1 |
|---|---|---|
|  |  | ch16 |
|  | ch26 |  |
|  | ch27 |  |
|  | ch28 |  |
|  | ch29 |  |
|  |  | ch17 |
|  | ch30 |  |
|  | ch31 |  |
|  |  | ch18 |
|  | ch32 |  |
|  | ch33 |  |
|  | ch34 |  |
|  |  | ch19 |
|  | ch35 |  |
|  | ch36 |  |
|  | ch37 |  |
|  |  | ch20 |
|  | ch38 |  |
|  | ch39 |  |
|  | ch40 |  |
|  |  | ch21 |
|  |  | ch22 |
|  |  | ch23 |
|  |  | ch24 |
|  |  | ch25 |
|  |  | ch26 |
|  |  | ch27 |
|  |  | ch28 |
|  |  | ch29 |
|  |  | ch30 |
|  |  | ch31 |
|  |  | ch32 |
|  |  | ch33 |
|  |  | ch34 |
|  |  | ch35 |
|  |  | ch36 |
|  |  | ch37 |
|  |  | ch38 |
|  |  | ch39 |
|  |  | ch40 |

FIG.16

| MAIN SCAN # n-1 | MAIN SCAN # n | MAIN SCAN # n+1 |
|---|---|---|
|  | ch1 |  |
| ch21 |  |  |
|  | ch2 |  |
|  | ch3 |  |
| ch22 |  |  |
| ch23 |  |  |
|  | ch4 |  |
| ch24 |  |  |
|  | ch5 |  |
|  | ch6 |  |
|  | ch7 |  |
| ch25 |  |  |
|  | ch8 |  |
|  | ch9 |  |
| ch26 |  |  |
|  | ch10 |  |
| ch27 |  |  |
| ch28 |  |  |
| ch29 |  |  |
|  | ch11 |  |
| ch30 |  |  |
|  | ch12 |  |
|  | ch13 |  |
|  | ch14 |  |
| ch31 |  |  |
|  | ch15 |  |
| ch32 |  |  |
| ch33 |  |  |
|  | ch16 |  |
| ch34 |  |  |
| ch35 |  |  |
| ch36 |  |  |
|  | ch17 |  |
| ch37 |  |  |
|  | ch18 |  |
|  | ch19 |  |
| ch38 |  |  |
| ch39 |  |  |
|  | ch20 |  |
| ch40 |  |  |
|  |  | ch1 |
|  | ch21 |  |
|  |  | ch2 |
|  |  | ch3 |
|  | ch22 |  |
|  | ch23 |  |
|  |  | ch4 |
|  | ch24 |  |
|  |  | ch5 |
|  |  | ch6 |
|  |  | ch7 |
|  | ch25 |  |
|  |  | ch8 |
|  |  | ch9 |
|  | ch26 |  |
|  |  | ch10 |
|  | ch27 |  |
|  | ch28 |  |
|  | ch29 |  |
|  |  | ch11 |

| MAIN SCAN # n-1 | MAIN SCAN # n | MAIN SCAN # n+1 |
|---|---|---|
|  | ch30 |  |
|  |  | ch12 |
|  |  | ch13 |
|  |  | ch14 |
|  | ch31 |  |
|  |  | ch15 |
|  | ch32 |  |
|  | ch33 |  |
|  |  | ch16 |
|  | ch34 |  |
|  | ch35 |  |
|  | ch36 |  |
|  |  | ch17 |
|  | ch37 |  |
|  |  | ch18 |
|  |  | ch19 |
|  | ch38 |  |
|  | ch39 |  |
|  |  | ch20 |
|  | ch40 |  |
|  |  | ch21 |
|  |  | ch22 |
|  |  | ch23 |
|  |  | ch24 |
|  |  | ch25 |
|  |  | ch26 |
|  |  | ch27 |
|  |  | ch28 |
|  |  | ch29 |
|  |  | ch30 |
|  |  | ch31 |
|  |  | ch32 |
|  |  | ch33 |
|  |  | ch34 |
|  |  | ch35 |
|  |  | ch36 |
|  |  | ch37 |
|  |  | ch38 |
|  |  | ch39 |
|  |  | ch40 |

X1 = X2 = X3 = X4

SURFACE-EMITTING LASER ARRAY, OPTICAL SCANNING DEVICE, AND IMAGE FORMING DEVICE

TECHNICAL FIELD

This invention relates to a surface-emitting laser array in which surface-emitting laser elements are arranged in a two-dimensional formation, an optical scanning device including the surface-emitting laser array, and an image forming device including the surface-emitting laser array.

BACKGROUND ART

In electrophotographic image formation, an image formation method using a laser beam is used widely in order for acquiring a high-density image quality. In the electrophotographic image formation, the commonly used method of forming an electrophotographic latent image on a photoconductor drum is that the surface of the photoconductive drum is optically scanned in the axial direction of the photoconductive drum (main scanning) by a laser beam output from a polygon mirror at the same time the photoconductor drum is rotated (sub-scanning).

In the electrophotographic image formation, formation of a high-density image at high speed is demanded. If the image resolution is doubled in order to perform a high-density image formation, the time needed for the main scanning and the time needed for the sub-scanning must be doubled, so that the total time needed for outputting a reconstructed image would be 4 times as much as before. Therefore, in order to perform a high-density image formation, it is necessary to increase the image output speed as well.

As a conceivable method for increasing the image output speed, the use of a laser beam with higher output level, the use of multiple laser beams, and the use of a photoconductor with higher photosensitivity may be taken into consideration. Especially, in a high-speed image forming device, a multi-beam light source which outputs multiple laser beams is commonly used. The area where a latent image is formed on the photoconductor in a case where "n" laser beams are used simultaneously is increased n times as large as that in a case where a single laser beam is used, and the time needed for the image formation can be reduced to 1/n.

Japanese Laid-Open Patent Application No. 11-340570 discloses a photoelectric conversion device which includes a plurality of photoelectric conversion parts arranged on a substrate. Japanese Laid-Open Patent Application No. 11-354888 discloses a semiconductor light emitting device which includes a plurality of light emitting parts arranged on a substrate. Each of these devices has a one-dimensional arrangement in which end-face emitting semiconductor lasers are arranged in one direction. In these cases, if the number of laser beams increases, the power dissipation becomes large, and it is necessary to arrange a cooling system for cooling the lasers. Practically, the limitation may be the device using four beams or eight beams in view of the cost.

On the other hand, as the research has been conducted briskly in recent years, surface-emitting lasers can be easily integrated on a substrate in a two-dimensional formation. The power dissipation of a surface-emitting laser is smaller than that of an end-face emitting laser, and it is advantageous that a large number of surface-emitting lasers can be arranged in a two-dimensional formation.

Japanese Laid-Open Patent Application No. 2005-274755 discloses an image forming device including an exposure unit which causes a charged surface of an electrophotographic photoconductor to be exposed to laser light so that an electrostatic latent image is formed on the photoconductor. This exposure unit has a surface-emitting laser array and is of multi-beam type in which the photoconductor surface is scanned by three or more light beams to form an electrostatic latent image on the photoconductor.

Japanese Laid-Open Patent Application No. 2005-234510 discloses an optical scanning device which includes a plurality of light sources (main light source, sub light source) for emitting a plurality of light beams to irradiate a scanned surface of a photoconductor, and a light source driving unit for driving the plurality of light sources. The optical scanning device controls the distribution of the quantity of light in the sub-scanning direction on the scanned surface of the photoconductor by the light beams output from the light sources by using the light source driving unit. For this purpose, the quantity-of-light ratio between the main light source and the sub light source is varied without changing the total quantity of light from the two light sources (main light source, sub light source) and without causing the quantity of light from the sub light source to exceed the quantity of light from the main light source.

Japanese Laid-Open Patent Application No. 2001-272615 discloses an optical scanning device including an optical deflector which deflects a plurality of light beams emitted from a light source unit to perform the scanning of the scanned surface of the photoconductor by the deflected light beams. The sub-scanning of the scanned surface of the photoconductor is performed by moving the scanned surface relative to the deflector in the sub-scanning direction perpendicular to the main scanning direction. In the light source unit, the light emitting points are arranged in a two-dimensional formation and rotated on the same plane by a predetermined angle in the main scanning direction or the sub-scanning direction so that the respective scanning lines by the light beams are arranged on the scanned surface at equal intervals.

The surface-emitting laser array according to the related art has a problem that, if the spacing between two of the light emitting parts is shortened, the laser output performance may decline or the reliability may fall due to the influence of heat generated in other light emitting parts.

DISCLOSURE OF THE INVENTION

In one aspect of the invention, the present disclosure provides an improved surface-emitting laser array in which the above-described problems are eliminated.

In one aspect of the invention, the present disclosure provides a surface-emitting laser array which is able to reduce the influence of heat generated in other light emitting parts without enlarging the size.

In one aspect of the invention, the present disclosure provides an optical scanning device which includes the surface-emitting laser array and is able to scan the surface of a photoconductor at high speed with high density.

In one aspect of the invention, the present disclosure provides an image forming device which includes the surface-emitting laser array and is able to form a high-density image at high speed.

In an embodiment of the invention which solves or reduces one or more of the above-mentioned problems, the present disclosure provides a surface-emitting laser array including a plurality of light emitting parts arranged in a two-dimensional formation having two orthogonal directions, wherein, when the plurality of light emitting parts are orthogonally projected on a virtual line parallel to one of the two orthogonal directions, a spacing between two of the plurality of light emitting parts along the virtual line is equal to an integral multiple of a predetermined value, wherein the plurality of light emitting parts include a first light emitting part, a second light emitting part adjacent to the first light emitting part along the virtual line, and a third light emitting part adjacent to the second light emitting part along the virtual line, and a spacing between the first and second light emitting parts differs from a spacing between the second and third light emitting parts in the one of the two orthogonal directions.

In the present disclosure, a spacing between two of the plurality of light emitting parts means a center-to-center distance between the two light emitting parts in one of the two orthogonal directions. The surface-emitting laser array of this invention makes it possible to selectively increase the spacing between two of the light emitting parts located in the area which is likely to receive the influences of heat from other light emitting parts. It is possible for the surface-emitting laser array of the invention to reduce the influence of heat generated in other light emitting parts, and it is not necessary to enlarge the size, in order to avoid the fall of the laser output performance due to the influence of heat.

In an embodiment of the invention which solves or reduces one or more of the above-mentioned problems, the present disclosure provides an optical scanning device comprising: a light source unit including the above-mentioned surface-emitting laser array, the light source unit having a main scanning direction and a sub-scanning direction parallel to the two orthogonal directions respectively; a deflection unit deflecting a plurality of laser beams emitted by the light source unit; and a scanning optical system focusing the laser beams output from the deflection unit on a scanned surface of a photoconductor. The optical scanning device of this invention includes the above-mentioned surface-emitting laser array, and it is possible to scan the surface of the photoconductor at high speed with high density.

In an embodiment of the invention which solves or reduces one or more of the above-mentioned problems, the present disclosure provides an image forming device comprising the above-mentioned optical scanning device and a photoconductor, wherein the optical scanning device scans a surface of the photoconductor by laser beams output from the optical scanning device, so that an image is formed on the photoconductor surface in accordance with image information of the laser beams. The image forming device of this invention includes the optical scanning device mentioned above, and it is possible to form a high-density image at high speed.

In an embodiment of the invention which solves or reduces one or more of the above-mentioned problems, the present disclosure provides an image forming device comprising the above-mentioned surface-emitting laser array, wherein the surface-emitting laser array is provided as a part of an optical writing unit, the optical writing unit outputting laser beams to a photoconductor when writing image information to the photoconductor. The image forming device of this invention includes the above-mentioned surface-emitting laser array, and it is possible to form a high-density image at high speed.

Other objects, features and advantages of the present invention will be apparent from the following detailed description when reading in conjunction with the accompanying drawings.

BRIEF DESCRIPTION OF THE DRAWINGS

FIG. 6 is a diagram for explaining the unequal interscan when using the surface-emitting laser array of FIG. 3.

FIG. 9 is a diagram for explaining the merit of the unequal interscan arrangement to the equal interscan arrangement.

FIG. 10 is a diagram for explaining the merit of the unequal interscan arrangement to the equal interscan arrangement.

FIG. 11 is a diagram for explaining the merit of the unequal interscan arrangement to the equal interscan arrangement.

FIG. 12 is a diagram for explaining the merit of the unequal interscan arrangement to the equal interscan arrangement.

FIG. 14 is a diagram for explaining the unequal interscan when using the surface-emitting laser array of FIG. 13.

FIG. 16 is a diagram for explaining the unequal interscan when using the surface-emitting laser array of FIG. 15.

BEST MODE FOR CARRYING OUT THE INVENTION

A description will be given of embodiments of the invention with reference to the accompanying drawings.

Figure 1:
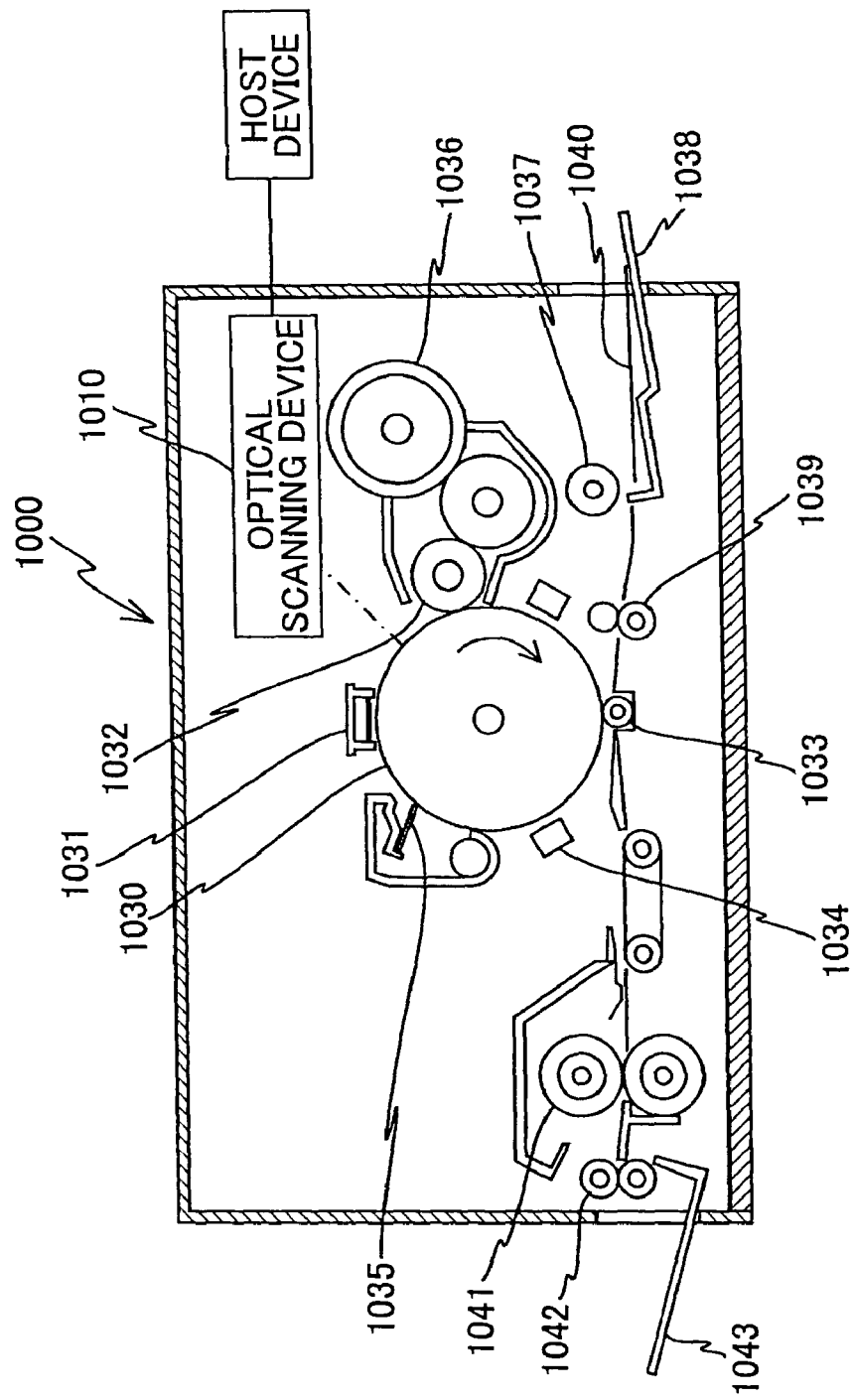
FIG. 1 is a diagram showing the composition of a laser printer in an embodiment of the invention.

FIG. 1 shows the composition of a laser printer 1000 which is an image forming device in an embodiment of the invention. This laser printer 1000 includes an optical scanning device 1010, a photoconductor drum 1030, an electric charger 1031, a developing roller 1032, a transfer charger 1033, an electric discharger 1034, a cleaning blade 1035, a toner cartridge 1036, a sheet feed roller 1037, a sheet feed tray 1038, a registration roller pair 1039, a fixing roller 1041, a sheet ejecting roller 1042, and a sheet ejecting tray 1043.

A photosensitive layer is formed on the surface of the photoconductor drum 1030. The surface of the photoconductor drum 1030 is the scanned surface. In this embodiment, the photoconductor drum 1030 is rotated in the direction indicated by the arrow in FIG. 1.

The electric charger 1031, the developing roller 1032, the transfer charger 1033, the electric discharger 1034, and the cleaning blade 1035 are arranged near the surface of the photoconductor drum 1030, respectively. The electric charger 1031, the developing roller 1032, the transfer charger 1033, the electric discharger 1034, and the cleaning blade 1035 are arranged in this order along the direction of rotation of the photoconductor drum 1030.

The electric charger 1031 electrically charges the surface of the photoconductor drum 1030 uniformly. The optical scanning device 1010 emits the light which is modulated in accordance with image information from a host device (for example, a personal computer), to the surface of the photoconductor drum 1030 charged by the electric charger 1031. Thereby, the latent image corresponding to the image information is formed on the surface of the photoconductor drum 1030. The latent image formed is moved toward the developing roller 1032 by the rotation of the photoconductor drum 1030. The composition of the optical scanning device 1010 will be described later.

Toner is stored in the toner cartridge 1036 and this toner is supplied to the developing roller 1032. The developing roller 1032 supplies the toner from the toner cartridge 1036 to the latent image formed on the surface of the photoconductor drum 1030, and the image information is visualized as a toner image. The latent image to which the toner is adhered (which will be called toner image) is moved to the transfer charger 1033 by the rotation of the photoconductor drum 1030.

A recording sheet 1040 is stored in the sheet feed tray 1038. The feed roller 1037 is disposed near the sheet feed tray 1038, and this feed roller 1037 takes out one recording sheet 1040 from the sheet feed tray 1038 and conveys it to the registration roller pair 1039. This registration roller pair 1039 temporarily holds the recording sheet 1040 taken out by the feed roller 1037, and sends out the recording sheet 1040 to the gap between the photoconductor drum 1030 and the transfer charger 1033 in accordance with the rotation of the photoconductor drum 1030.

In order to draw electrically the toner on the surface of the photoconductor drum 1030 towards the recording sheet 1040, a voltage of polarity opposite to the polarity of the toner is applied to the transfer charger 1033. The toner image on the surface of the photoconductor drum 1030 is transferred to the recording sheet 1040 by this voltage of the transfer charger 1033. The recording sheet 1040 which the toner image is transferred to is sent to the fixing roller 1041.

The fixing roller 1041 applies heat and pressure to the recording sheet 1040, and the toner is fixed to the recording sheet 1040. The recording sheet 1040 which the toner is fixed to is sent to the sheet ejecting tray 1043 via the sheet ejecting roller 1042, and the recording sheet is stacked one by one on the sheet ejecting tray 1043.

The electric discharger 1034 discharges the electricity from the surface of the photoconductor drum 1030. The cleaning blade 1035 removes the toner (the remaining toner) from the surface of the photoconductor drum 1030. The surface of the photoconductor drum 1030 from which the remaining toner is removed is returned again to the position where the surface faces the electric charger 1031.

Next, the composition of an optical scanning device 1010 in an embodiment of the invention will be explained.

Figure 2:
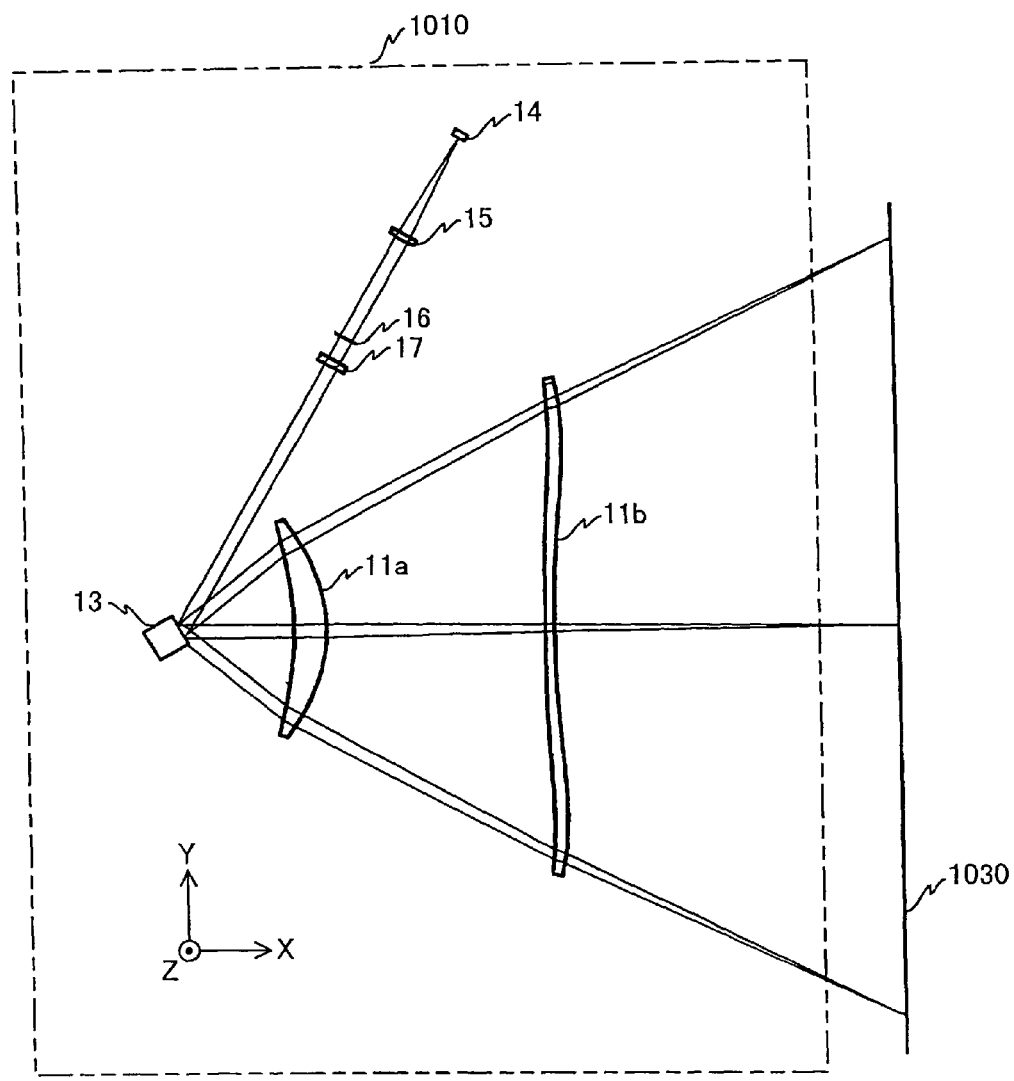
FIG. 2 is a diagram showing the composition of an optical scanning device provided in the laser printer of FIG. 1.

As shown in FIG. 2, this optical scanning device 1010 includes a light source 14, a coupling lens 15, an aperture plate 16, a cylindrical lens 17, a polygon mirror 13, a deflector side scanning lens 11*a*, an image surface side scanning lens 11*b*, and a scanning control device (not illustrated).

In the present disclosure, a direction which is parallel to the longitudinal direction of the photoconductor drum 1030 is assumed as being the direction of the Y-axis in a XYZ three-dimensional orthogonal coordinate system, and a direction which is parallel to the optical axis of each scanning lens (11*a*, 11*b*) is assumed as being the direction of the X-axis. For the sake of convenience, in the present disclosure, a direction parallel to the main scanning direction is called main scanning direction, and a direction parallel to the sub-scanning direction is called sub-scanning direction.

Figure 3:
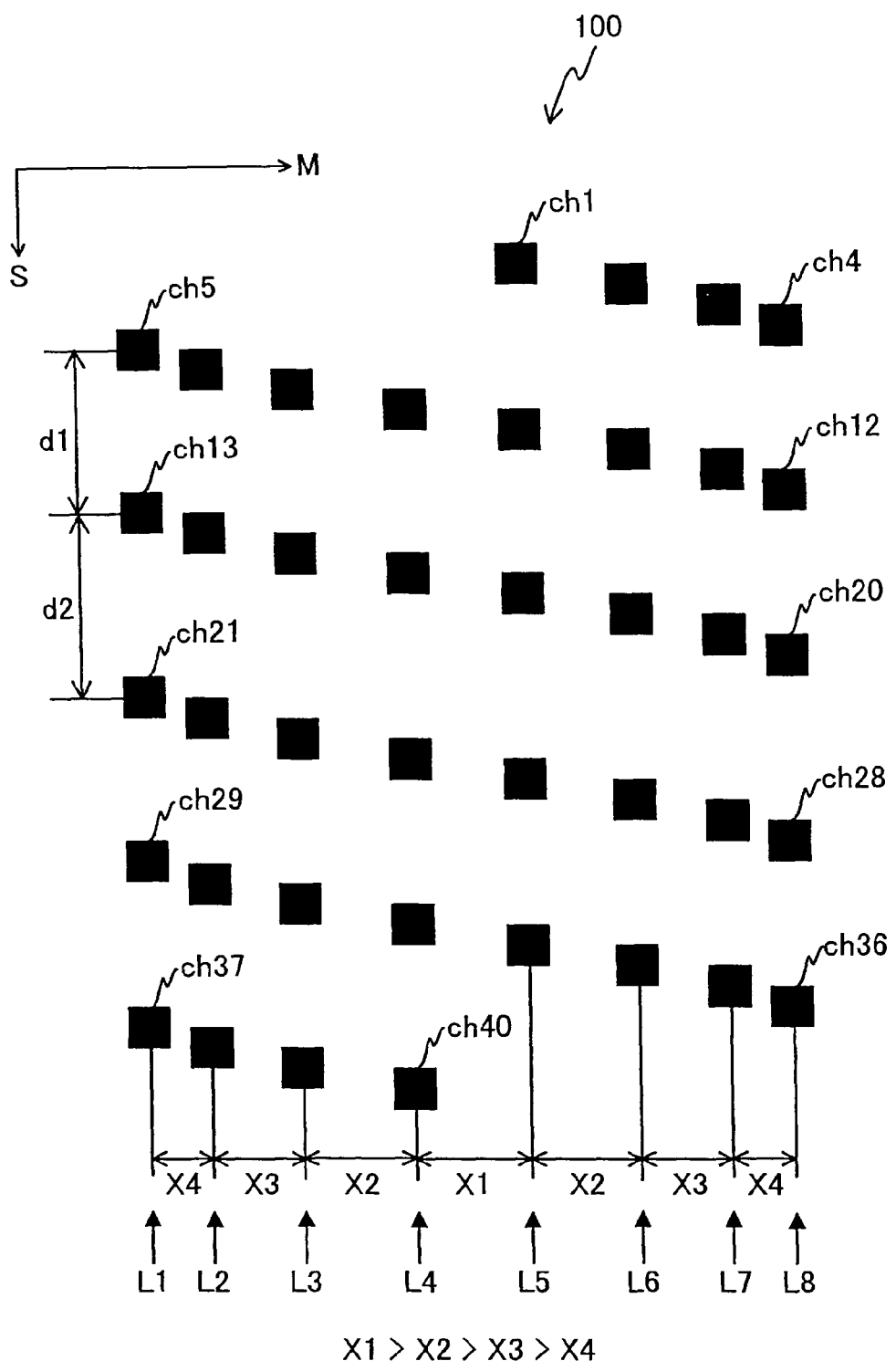
FIG. 3 is a diagram showing the composition of a surface-emitting laser array in a light source provided in the optical scanning device of FIG. 2.

As shown in FIG. 3, the light source 14 includes 40 light emitting parts (ch1-ch40) which are arranged in a two-dimensional array 100 formed on one substrate. Eight rows of light emitting parts, each row including five light emitting parts arranged in the sub-scanning direction (which is indicated as the direction of S) are arranged in the main scanning direction (which is indicated as the direction of M). Namely, the number of the light emitting part rows is larger than the number of the light emitting parts contained in one light emitting part row.

For the sake of convenience, in order to identify each light emitting part row, the eight rows of light emitting parts from the left to the right of FIG. 3 are called the first light emitting part row L1, the second light emitting part row L2, the third light emitting part row L3, the fourth light emitting part row L4, the fifth light emitting part row L5, the sixth light emitting part row L6, the seventh light emitting part row L7, and the eighth light emitting part row L8.

When the 40 light emitting parts are orthogonally projected on a virtual line parallel to the direction of S, the light emitting part which lies uppermost on the −S direction side is referred to as light emitting part ch1, and other light emitting parts are referred to as light emitting part ch2, light emitting part ch3, ..., light emitting part ch40 in the down sequence toward the +S direction side.

In this embodiment, five light emitting parts of the first light emitting part row L1 are light emitting part ch5, light emitting part ch13, light emitting part ch21, light emitting part ch29, and light emitting part ch37.

Five light emitting parts of the second light emitting part row L2 are light emitting part ch6, light emitting part ch14, light emitting part ch22, light emitting part ch30, and light emitting part ch38.

Five light emitting parts of the third light emitting part row L3 are light emitting part ch7, light emitting part ch15, light emitting part ch23, light emitting part ch31, and light emitting part ch39.

Five light emitting parts of the fourth light emitting part row L4 are light emitting part ch8, light emitting part ch16, light emitting part ch24, light emitting part ch32, and light emitting part ch40.

Five light emitting parts of the fifth light emitting part row L5 are light emitting part ch1, light emitting part ch9, light emitting part ch17, light emitting part ch25, and light emitting part ch33.

Five light emitting parts of the sixth light emitting part row L6 are light emitting part ch2, light emitting part ch10, light emitting part ch18, light emitting part ch26, and light emitting part ch34.

Five light emitting parts of the seventh light emitting part row L7 are light emitting part ch3, light emitting part ch11, light emitting part ch19, light emitting part ch27, and light emitting part ch35.

Five light emitting parts of the eighth light emitting part row L8 are light emitting part ch4, light emitting part ch12, light emitting part ch20, light emitting part ch28, and light emitting part ch36.

In this embodiment, with respect to the direction of M, the spacing between the first light emitting part row L1 and the second light emitting part row L2 is set to X4, the spacing between the second light emitting part row L2 and the third light emitting part row L3 is set to X3, the spacing between the third light emitting part row L3 and the fourth light emitting part row L4 is set to X2, the spacing between the fourth light emitting part row L4 and the fifth light emitting part row L5 is set to X1, the spacing between the fifth light emitting part row L5 and the sixth light emitting part row L6 is set to X2, the spacing between the sixth light emitting part row L6 and the seventh light emitting part row L7 is set to X3, the spacing between the seventh light emitting part row L7 and the eighth light emitting part row L8 is set to X4, and the conditions: X1>X2>X3>X4 are met.

Namely, the two-dimensional array 100 in this example has an unequal two-dimensional arrangement, and the spacing between two adjacent ones of the plurality of light emitting part rows which are located at a central portion of the two-dimensional arrangement is larger than the spacing between two adjacent ones of the plurality of light emitting part rows which are located at an end portion of the two-dimensional arrangement.

Figure 4:
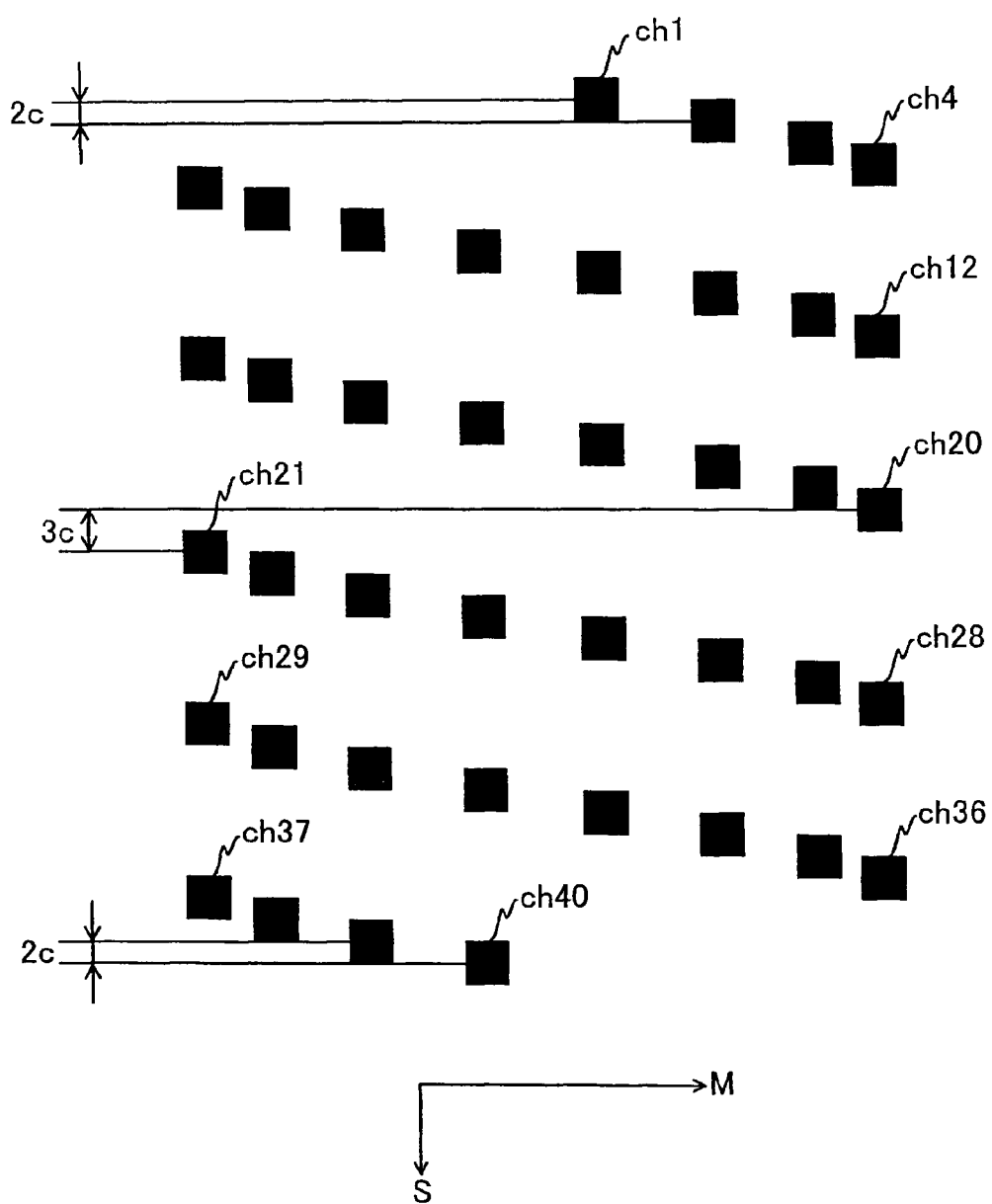
FIG. 4 is a diagram showing the composition of the surface-emitting laser array provided in the light source provided in the optical scanning device of FIG. 2.

Suppose that c denotes a predetermined value. As shown in FIG. 4, when the 40 light emitting parts are orthogonally projected on the virtual line parallel to the direction of S, the light emitting parts ch1-ch20 have equal spacings $2c$, a spacing between the light emitting part ch20 and the light emitting part ch21 is equal to $3c$, and the light emitting parts ch21-ch40 have equal spacings $2c$. Specifically, c=4.4 micrometers, X1=48 micrometers, X2=46.5 micrometers, X3=38.5 micrometers, and X4=26 micrometers. The spacing d1 in the direction of S between light emitting part ch5 and light emitting part ch13 is equal to 70.4 micrometers (=2c×8), and the spacing d2 in the direction of S between light emitting part ch13 and light emitting part ch21 is equal to 74.8 micrometers (=2c×7+3c) (refer to FIG. 3).

Figure 5A:
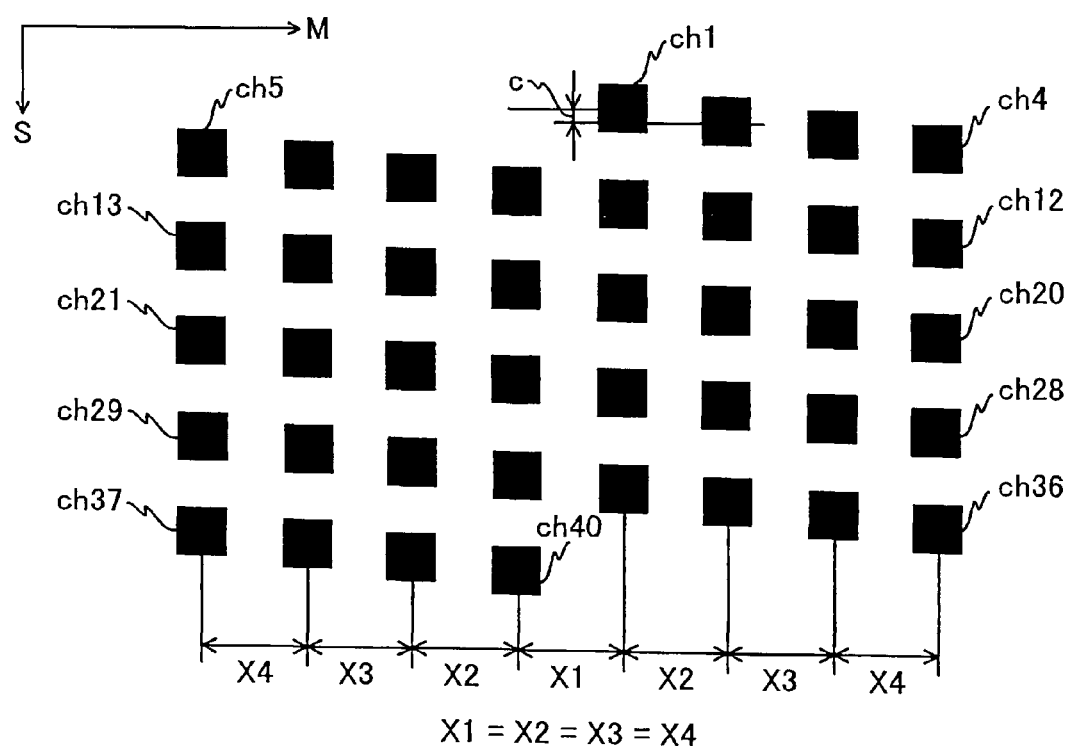
FIG. 5A is a diagram showing the composition of a comparative example of a surface-emitting laser array.

FIG. 5A shows the composition of a comparative example of a surface-emitting laser array. In this two-dimensional array, 40 light emitting parts are arranged in the direction of M and the direction of S with the respective spacings between two of the light emitting parts being equal intervals.

Figure 5B:
FIG. 5B is a diagram for explaining operation of the comparative example of the surface-emitting laser array.

In this two-dimensional array, a contiguity scan is performed at the time of main scanning (refer to FIG. 5B). Namely, the two-dimensional array shown in FIG. 5A is a two-dimensional array having a contiguity scanning arrangement.

Referring back to FIG. 2, the coupling lens 15 converts the light rays output from the light source 14 into generally parallel light rays. The aperture plate 16 has an opening which specifies the beam diameter of the light output from the coupling lens 15.

The cylindrical lens 17 focuses the light rays passing through the opening of the aperture plate 16 onto a position near the deflection/reflection surface of the polygon mirror 13 with respect to the direction of the Z-axis.

The optical system which is arranged on the optical path between the light source 14 and the polygon mirror 13 may also be called the pre-deflector optical system. In this embodiment, the pre-deflector optical system includes a coupling lens 15, an aperture plate 16, and a cylindrical lens 17.

The polygon mirror 13 has four mirrors, and each mirror serves as a deviation/reflection surface of the polygon mirror 13, respectively. This polygon mirror 13 is uniformly rotated around the axis parallel to the direction of the Z-axis, and deflects the light from the cylindrical lens 17.

The deflector side scanning lens 11a is arranged on the optical path of the light deflected by the polygon mirror 13. The image surface side scanning lens 11b is arranged on the optical path of the light output from the deflector side scanning lens 11a.

The light output from the image surface side scanning lens 11b is directed to the surface of the photoconductor drum 1030, and a light spot is formed on the surface of the photoconductor drum 1030. This light spot is moved in the longitudinal direction of the photoconductor drum 1030 by the rotation of the polygon mirror 13. Namely, the surface of the photoconductor drum 1030 is scanned by the light from the polygon mirror 13.

The moving direction of the light spot at this time corresponds to the main scanning direction. The direction of rotation of the photoconductor drum 1030 corresponds to the sub-scanning direction.

As shown in FIG. 6, the scanning control device controls the optical scanning device as follows. After the (n−1)-th main scanning is completed, the photoconductor drum 1030 is rotated to direct the light from the light emitting part ch1 to the position which is shifted in the sub-scanning direction by the amount corresponding to "−c" from the position to which the light from the light emitting part ch21 is directed on the surface of the photoconductor drum 1030, and then the n-th main scanning is performed. After the n-th main scanning is completed, the photoconductor drum 1030 is rotated to direct the light from the light emitting part ch1 to the position which is shifted in the sub-scanning direction by the amount corresponding to "−c" from the position to which the light from the light emitting part ch21 on the surface of the photoconductor drum 1030, and then the (n+1)-th main scanning is performed.

That is, unequal interscan is performed by the optical scanning device of this embodiment. This allows the main scanning to be performed on the surface of the photoconductor drum 1030 at a constant interval corresponding to the predetermined value c in the sub-scanning direction. In this case, when the magnification of the optical system of the optical scanning device 1010 is equal to about 1.2, the pitch in the sub-scanning direction on the surface of the photoconductor drum 1030 is equal to about 5.3 micrometers, and optical writing with the high density of 4800 dpi with respect to the sub-scanning direction can be attained.

Examples of the equal interscan and the two-dimensional array suitable for the equal interscan (two-dimensional array of equal interscan arrangement) are disclosed in Japanese Patent Publication No. 1-45065 and Japanese Patent Publication No. 6-48846.

In the embodiment of FIG. 4, the light emitting part ch1 is included in the light emitting part row L5, and the light emitting part ch40 is included in the light emitting part row L4. In other words, the two light emitting parts (ch1 and ch40) are located at the uppermost and lowermost ends of the two-dimensional array in the direction of S when the 40 light emitting parts are orthogonally projected on the virtual line parallel to the direction of S, and these light emitting parts are located at positions other than the ends of the two-dimensional array in the direction of M.

Namely, the light emitting part ch1 and the light emitting part ch40 which are located at the ends of the two-dimensional array in the direction of S may be arranged in the vicinity to each other in the direction of M. It is possible for this embodiment to reduce the beam pitch errors in the sub-scanning direction resulting from the errors of the polygon mirror (dimensional variations, surface deviation, axial deviation, etc.).

As described above, in the surface-emitting laser array 100 of this embodiment, when the 40 light emitting parts are orthogonally projected on a virtual line parallel to the sub-scanning direction of S (one of the two orthogonal directions), assuming that c denotes a predetermined value, the light emitting parts ch1-ch20 have equal spacings $2c$, the spacing between the light emitting part ch20 and the light emitting part ch21 is equal to $3c$, and the light emitting parts ch21-ch40 have equal spacings $2c$.

When the two-dimensional array of this embodiment and the two-dimensional array of contiguity scanning arrangement are compared, the size of the two-dimensional array of this embodiment is slightly larger than that of the latter, but the heat dissipation of this embodiment improves remarkably rather than that of the two-dimensional array of contiguity scanning arrangement. That is, because the spacing between the light emitting parts of this embodiment in the sub-scanning direction can be enlarged from that of contiguity scanning arrangement when compared at the same writing density, the output can be easily equalized by the reduction of thermal interference, concentration unevenness can be reduced, and image formation with good quality can be performed.

When the two-dimensional array of this embodiment and the two-dimensional array of equal interscan arrangement both having the same size are compared, the heat dissipation of this embodiment improves remarkably rather than that of the two-dimensional array of equal interscan arrangement. That is, the spacing between the light emitting parts located in the area which is likely to receive the influences of heat from other light emitting parts can be selectively enlarged, and it is not necessary to enlarge the size. Therefore, it is possible for this embodiment to reduce the influence of heat generated in other light emitting parts, without enlarging the size.

In this embodiment, eight rows of light emitting parts, each row including five light emitting parts arranged in the direction of S, are arranged in a direction parallel to the main scanning direction of M. With respect to the direction of M, the spacing between the first light emitting part row L1 and the second light emitting part row L2 is set to X4, the spacing between the second light emitting part row L2 and the third light emitting part row L3 is set to X3, the spacing between the third light emitting part row L3 and the fourth light emitting part row L4 is set to X2, the spacing between the fourth light emitting part row L4 and the fifth light emitting part row L5 is set to X1, the spacing between the fifth light emitting part row L5 and the sixth light emitting part row L6 is set to X2, the spacing between the sixth light emitting part row L6 and the seventh light emitting part row L7 is set to X3, the spacing between the seventh light emitting part row L7 and the eighth light emitting part row L8 is set to X4, and the conditions: X1>X2>X3>X4 are met.

When two or more light emitting parts operate simultaneously, the influence of heat, generated in the light emitting part arranged at the peripheral portion of the surface-emitting laser array, on the light emitting parts arranged at the central portion of the surface-emitting laser array is reduced. The temperature rise of the light emitting parts arranged at the central portion can be reduced rather than in the case in which a plurality of light emitting parts are arranged at equal intervals in the direction of S and in the direction of M.

Therefore, the output characteristics of the respective light emitting parts can be equalized, and consequently, it is possible to carry out image formation with good quality. Moreover, the temperature of the light emitting parts which are subjected to the highest temperature can be lowered, and the life of the surface-emitting laser array can be lengthened.

Moreover, the number of the light emitting part rows is larger than the number of the light emitting parts contained in one light emitting part row. The influence of heat between the light emitting parts can be reduced, the space needed for forming the wiring of the respective light emitting parts can be held, and the optical writing density can be increased.

In the optical scanning device 1010 of this embodiment, the light source 14 includes the surface-emitting laser array 100, and it is possible to scan the surface of the photoconductor drum 1030 at high speed with high density. The reduction of the thermal influence will facilitate the control to equalize the laser output performance. As a result, the unevenness in the optical density of an output image is suppressed, and image formation with good quality can be attained.

In the case of the above-mentioned contiguity scan (FIG. 5B), a relatively large intensity of optical writing may arise at the ends of the two-dimensional array in the main scanning direction. However, the interscan can be performed by the surface-emitting laser array of this embodiment, and the undesired problem can be eliminated.

Because the life of the surface-emitting laser array of this embodiment can be extended, reuse of a light source unit including the light source 14 is possible. In the laser printer 1000 of this embodiment, the optical scanning device 1010 is provided, and it is possible to form a high-density image at high speed. If the image forming speed that is the same as that of the related art can be maintained, the number of light emitting parts contained in a surface-emitting laser array can be reduced, and this allows the manufacturing yield of surface-emitting laser array to improve, and attains low cost production. In addition, it is possible to carry out image formation without reducing the image forming speed, even if the optical writing dot density increases.

Figure 7:
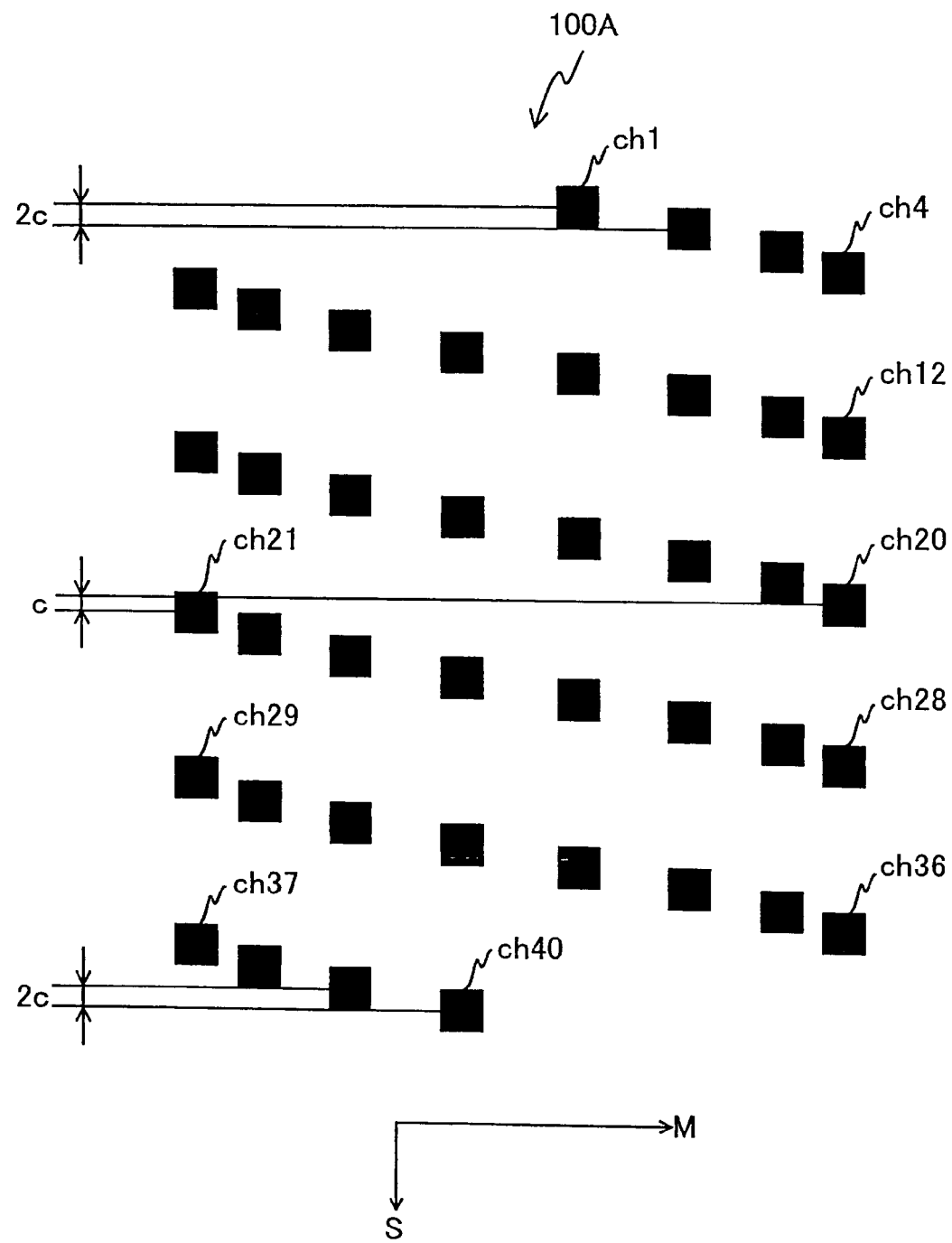
FIG. 7 is a diagram for explaining a modification of a surface-emitting laser array in an embodiment of the invention.

The above-mentioned embodiment may be modified such that a surface-emitting laser array 100A shown in FIG. 7 is used instead of the surface-emitting laser array 100.

As shown in FIG. 7, in this surface-emitting laser array 100A, when the 40 light emitting parts are orthogonally projected on a virtual line parallel to the direction of S, the light emitting parts ch1-ch20 have equal spacings $2c$, the spacing between the light emitting part ch20 and the light emitting part ch21 is equal to $c$, and the light emitting parts ch21-ch40 have equal spacings $2c$. Suppose that c denotes a predetermined value.

In this case, only the spacing between light emitting part ch20 and light emitting part ch21 in the direction of S is smaller than the spacings of other light emitting parts, but the spacings of the other light emitting parts in the direction of S are twice as large as those of the tow-dimensional array shown in FIG. 5A. Although the size of this embodiment is slightly larger than that of the two-dimensional array of contiguity scanning arrangement (FIG. 5A), the heat dissipation of this embodiment can be remarkably raised rather than the two-dimensional array of contiguity scanning arrangement.

Figure 8:
FIG. 8 is a diagram for explaining the unequal interscan when using the surface-emitting laser array of FIG. 7.

FIG. 8 shows the case in which unequal interscan is performed using the surface-emitting laser array 100A of FIG. 7. In this case, the main scanning is performed on the surface of the photoconductor drum 1030 at a constant interval corresponding to the predetermined value c in the sub-scanning direction. Specifically, X1=48 micrometers, X2=46.5 micrometers, X3=38.5 micrometers, and X4=26 micrometers.

As is apparent from FIG. 8 when compared with FIG. 6, the optical writing in this case is performed without continuing the light emitting part ch1 following the light emitting part ch40. The two light emitting parts are most distant in the sub-scanning direction on the surface-emitting laser array. The influence of banding by the beam pitch error in the sub-scanning direction resulting from the errors of the polygon mirror 13 can be reduced, and the worsening of image quality can be reduced.

Moreover, because it is possible for this embodiment to shorten the total distance in the sub-scanning direction while using the interscan arrangement, the beam pitch errors with respect to the sub-scanning direction can be reduced and the light spots can be stabilized.

Next, a description will be given of the merit of unequal interscan arrangement to equal interscan arrangement with reference to FIGS. 9 through 13.

For the sake of simplicity, the mode in which a space in the sub-scanning direction is covered by two main scanning lines (which is referred to as a two-scan mode) will be explained. Alternatively, a space in the sub-scanning direction may be covered by three or more main scanning lines. However, because the light emitting part spacings in the case of the three-scan mode spread so much, a relatively large optical element will be needed and the optical characteristics will fall. For this reason, when a large number of light emitting parts are used, the two-scan mode is preferred. For example, Japanese Laid-Open Patent Application No. 2003-255247 discloses that it is preferred that the number of light emitting parts in an array is even, such as a multiple of 8, when controlling the respective light emitting parts in the array.

FIG. 9 shows the case in which an even number of light emitting parts (8 channels) perform equal interscan using the surface-emitting laser array of equal interscan arrangement. FIG. 10 shows the case in which an odd number of light emitting parts (7 channels) perform equal interscan using the surface-emitting laser array of equal interscan arrangement.

FIG. 11 shows the case in which an even number of light emitting parts (8 channels) perform unequal interscan using the surface-emitting laser array of unequal interscan arrangement. FIG. 12 shows the case in which an odd number of light emitting parts (7 channels) perform unequal interscan using the surface-emitting laser array of unequal interscan arrangement.

As is apparent from FIG. 9, when the even number of light emitting parts perform equal interscan, the scanning line is covered, but the shifting amount in the sub-scanning direction is varied for every main scanning. In order to vary the shifting amount in the sub-scanning direction irregularly, it is necessary to change the rotational speed of the polygon mirror, the configuration of the polygon mirror, and the rotational speed of the photoconductor drum. However, changing the rotational speed or the positional phase causes the rotation irregularity to arise. A positional deviation in the sub-scanning direction (banding, etc.) may arise on the polygon mirror, and a positional deviation in the main scanning direction (vertical line fluctuation, etc.) may arise on the photoconductor drum surface. It is very difficult to control these parameters with high precision.

For this reason, it is preferred that the rotational speed of the polygon mirror (main scanning speed) and the rotational speed of the photoconductor drum (sub-scanning speed) are held at a constant level during optical writing. Accordingly, when the two-scan mode is used and equal interscan is performed, it is necessary that the number of light emitting parts in the array is odd.

On the other hand, when the two-scan mode is used and unequal interscan is performed, it is necessary that the number of light emitting parts in the array is even. As is apparent from FIG. 12, if the number of light emitting parts in the array is odd, omission of a scanning line arises. In order to perform interscan by using an even number of light emitting parts, it is preferred to use the unequal interscan arrangement. In order to perform interscan by using an even number of light emitting parts without extending the light emitting part spacing, it is preferred to use the unequal interscan arrangement and the two-scan mode.

Figure 13:
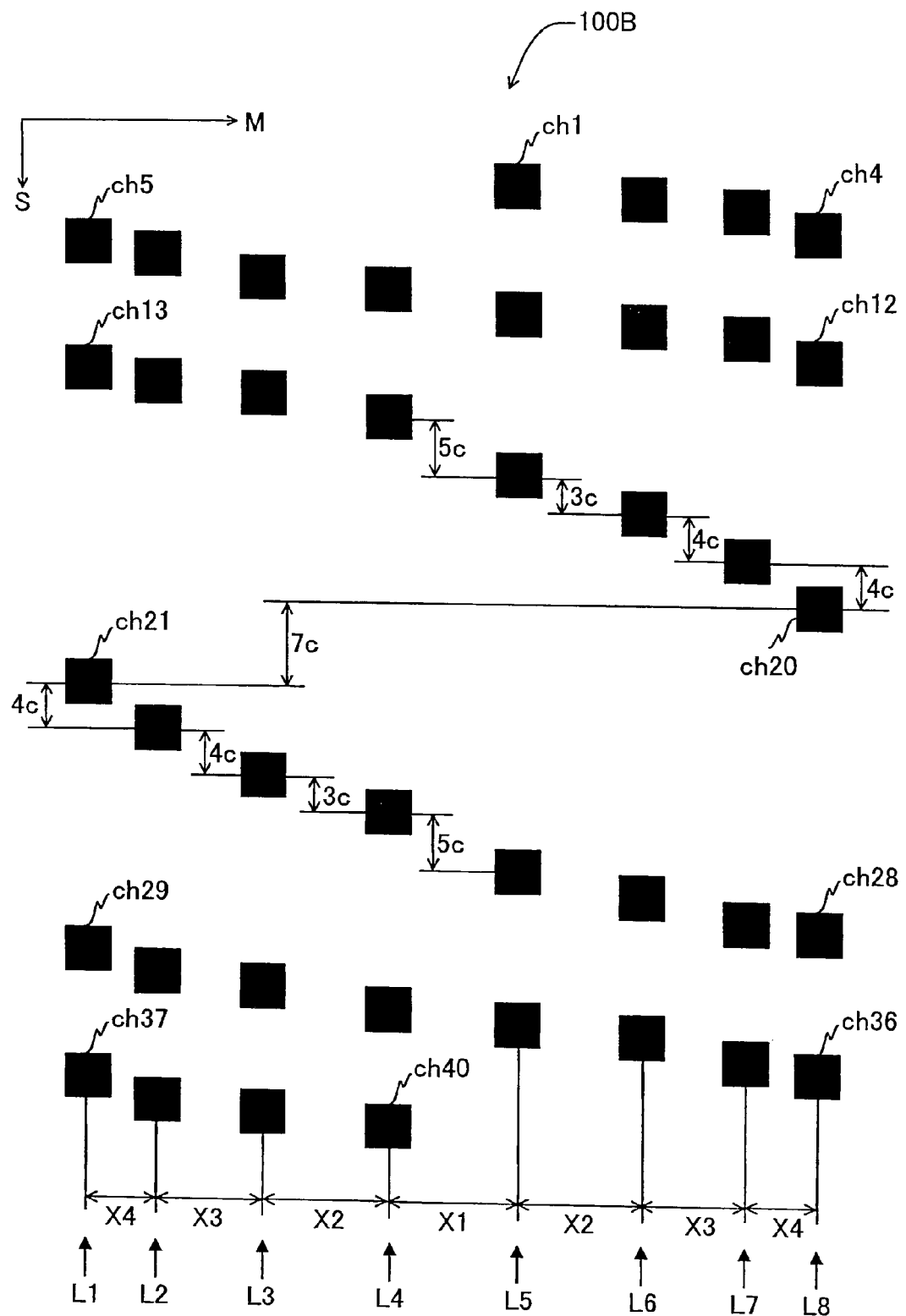
FIG. 13 is a diagram for explaining a modification of a surface-emitting laser array in an embodiment of the invention.

The above-mentioned embodiment may be modified such that a surface-emitting laser array 100B shown in FIG. 13 is used instead of the surface-emitting laser array 100.

As shown in FIG. 13, in this surface-emitting laser array 100B, when the 40 light emitting parts are orthogonally projected on the virtual line parallel to the direction of S, the light emitting parts ch1-ch3, the light emitting parts ch4-ch6, the light emitting parts ch7-ch9, the light emitting parts ch10-ch11, the light emitting parts ch12-15, the light emitting parts ch26-ch29, the light emitting parts ch30-ch31, the light emitting parts ch32-34, the light emitting parts ch35-ch37, and the light emitting parts ch38-ch40 have equal spacings c, predetermined value.

Moreover, the light emitting parts ch3-ch4, the light emitting parts ch6-ch7, the light emitting parts ch9-ch10, the light emitting parts ch15-ch16, the light emitting parts ch29-ch30, the light emitting parts ch31-ch32, the light emitting parts ch34-ch35, and the light emitting parts ch37-ch38 have equal spacings 2c, respectively.

Moreover, the light emitting parts ch17-ch18 and the light emitting parts ch23-ch24 have equal spacings 3c, respectively, and the light emitting parts ch18-ch20 and the light emitting parts ch21-ch23 have equal spacings 4c, respectively.

Moreover, the light emitting parts ch16-ch17 and the light emitting parts ch24-ch25 have equal spacings 5c, respectively, and the spacing between the light emitting part ch20 and the light emitting part ch21 is equal to 7c.

FIG. 14 shows the case in which unequal interscan is performed using the surface-emitting laser array 100B of FIG. 13. In this case, the main scanning is performed on the surface of the photoconductor drum 1030 at a constant interval corresponding to the predetermined value c in the sub-scanning direction. Specifically, X1=48 micrometers, X2=46.5 micrometers, X3=38.5 micrometers, and X4=26 micrometers.

Figure 15:
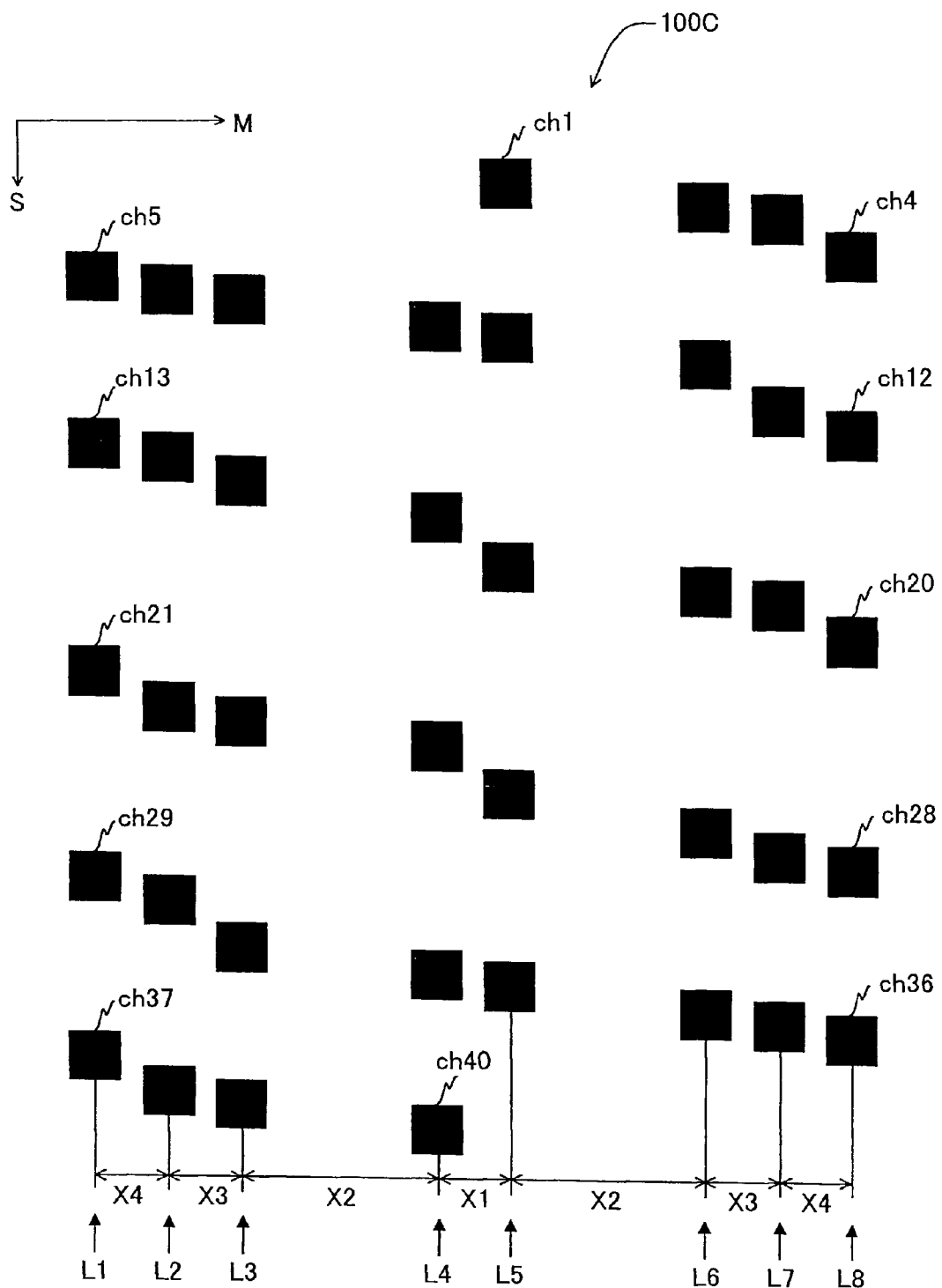
FIG. 15 is a diagram for explaining a modification of a surface-emitting laser array in an embodiment of the invention.

The above-mentioned embodiment may be modified such that a surface-emitting laser array 100C shown in FIG. 15 is used instead of the surface-emitting laser array 100.

As shown in FIG. 15, in this surface-emitting laser array 100C, when the 40 light emitting parts are orthogonally projected on the virtual line parallel to the direction of S, the light emitting parts ch2-ch3, the light emitting parts ch5-ch7, the light emitting parts ch8-ch9, the light emitting parts ch12-ch14, the light emitting parts ch18-ch19, the light emitting parts ch22-ch23, the light emitting parts ch27-ch29, the light emitting parts ch32-ch33, the light emitting parts ch34-ch36, and the light emitting parts ch38-ch39 have equal spacings c, respectively. Suppose that c denotes a predetermined value.

Moreover, the light emitting parts ch1-ch2, the light emitting parts ch4-ch5, the light emitting parts ch7-ch8, the light emitting parts ch9-ch10, the light emitting part ch11-ch12, the light emitting parts ch14-ch15, the light emitting parts ch17-ch18, the light emitting parts ch23-ch24, the light emitting parts ch26-ch27, the light emitting parts ch29-ch30, the light emitting parts ch31-ch32, the light emitting parts ch33-ch34, the light emitting parts ch36-ch37, and the light emitting parts ch39-ch40 have equal spacings 2c, respectively.

Moreover, the light emitting parts ch3-ch4, the light emitting parts ch15-ch16, the light emitting parts ch19-ch22, the light emitting parts ch25-ch26, and the light emitting parts ch37-ch38 have equal spacings 3c, respectively. Moreover, the light emitting parts ch10-ch11, the light emitting parts ch16-ch17, the light emitting parts ch24-ch25, and the light emitting parts ch30-ch31 have equal spacings 4c, respectively.

FIG. 16 shows the case in which unequal interscan is performed using the surface-emitting laser array 100C. In this case, the main scanning is performed on the surface of the photoconductor drum 1030 at a constant interval corresponding to the predetermined value c in the sub-scanning direction. Specifically, X1=26 micrometers, X2=70 micrometers, X3=26 micrometers, and X4=26 micrometers.

Figure 17:
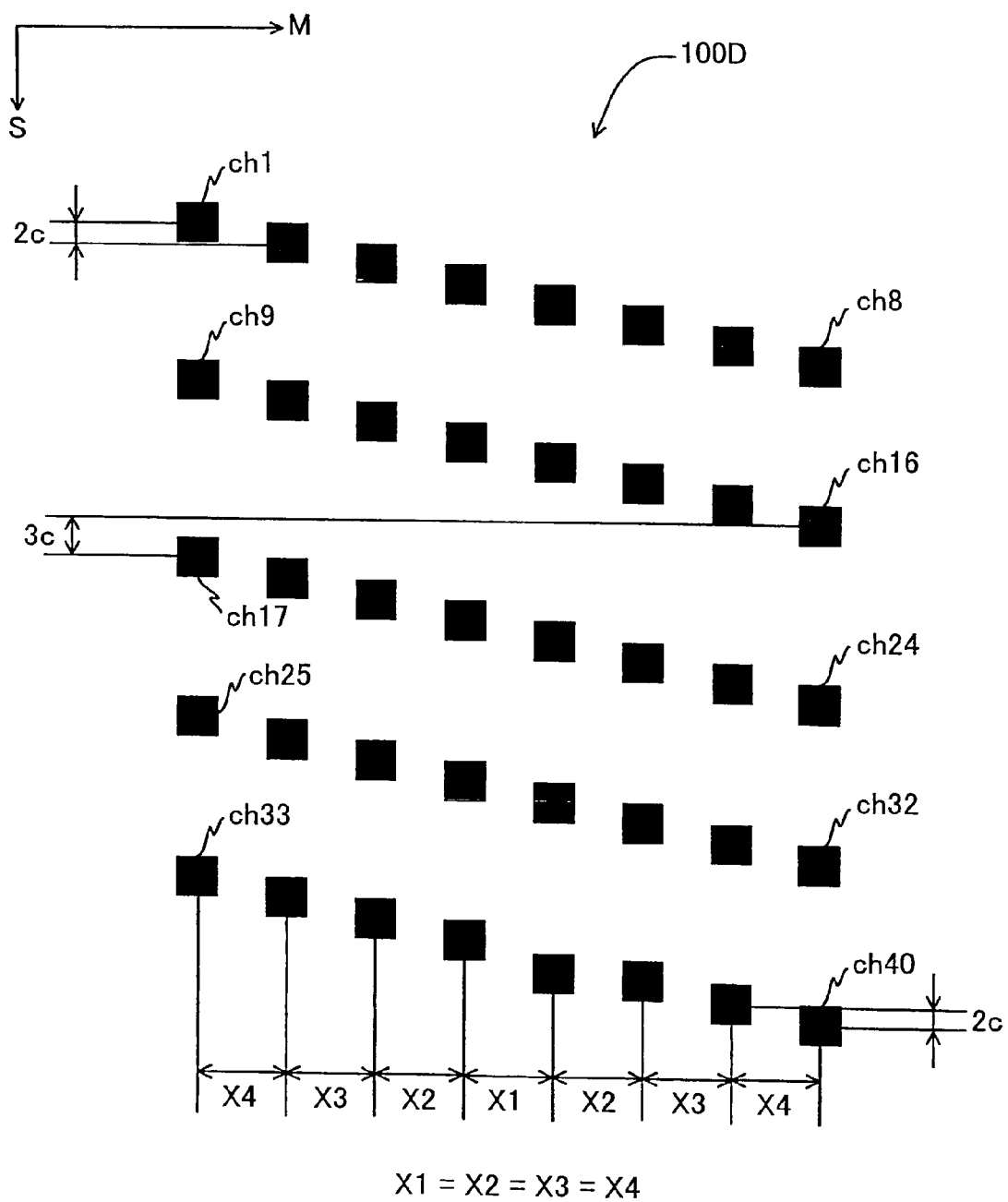
FIG. 17 is a diagram for explaining a modification of a surface-emitting laser array in an embodiment of the invention.

The above-mentioned embodiment may be modified such that a surface-emitting laser array 100D shown in FIG. 17 is used instead of the surface-emitting laser array 100.

As shown in FIG. 17, in this surface-emitting laser array 100D, the light emitting part ch1 is arranged at the uppermost position in the −S side direction and the leftmost position in the −M side direction, and the light emitting part ch40 is arranged at the lowermost position in the +S side direction and the rightmost position in the +M side direction.

Moreover, in the surface-emitting laser array 100D, when the 40 light emitting parts are orthogonally projected on the virtual line parallel to the direction of S, the light emitting parts ch1-ch16 have equal spacings 2c, respectively. Suppose that c denotes a predetermined value.

Moreover, the surface-emitting laser array 100D is arranged so that the spacing between the light emitting part ch16 and the light emitting part ch17 is equal to 3c, and the light emitting parts ch17-ch40 have equal spacings 2c, respectively. The respective spacings between two of the light emitting part rows of the surface-emitting laser array 100D in the direction of M are equal.

Figure 18:
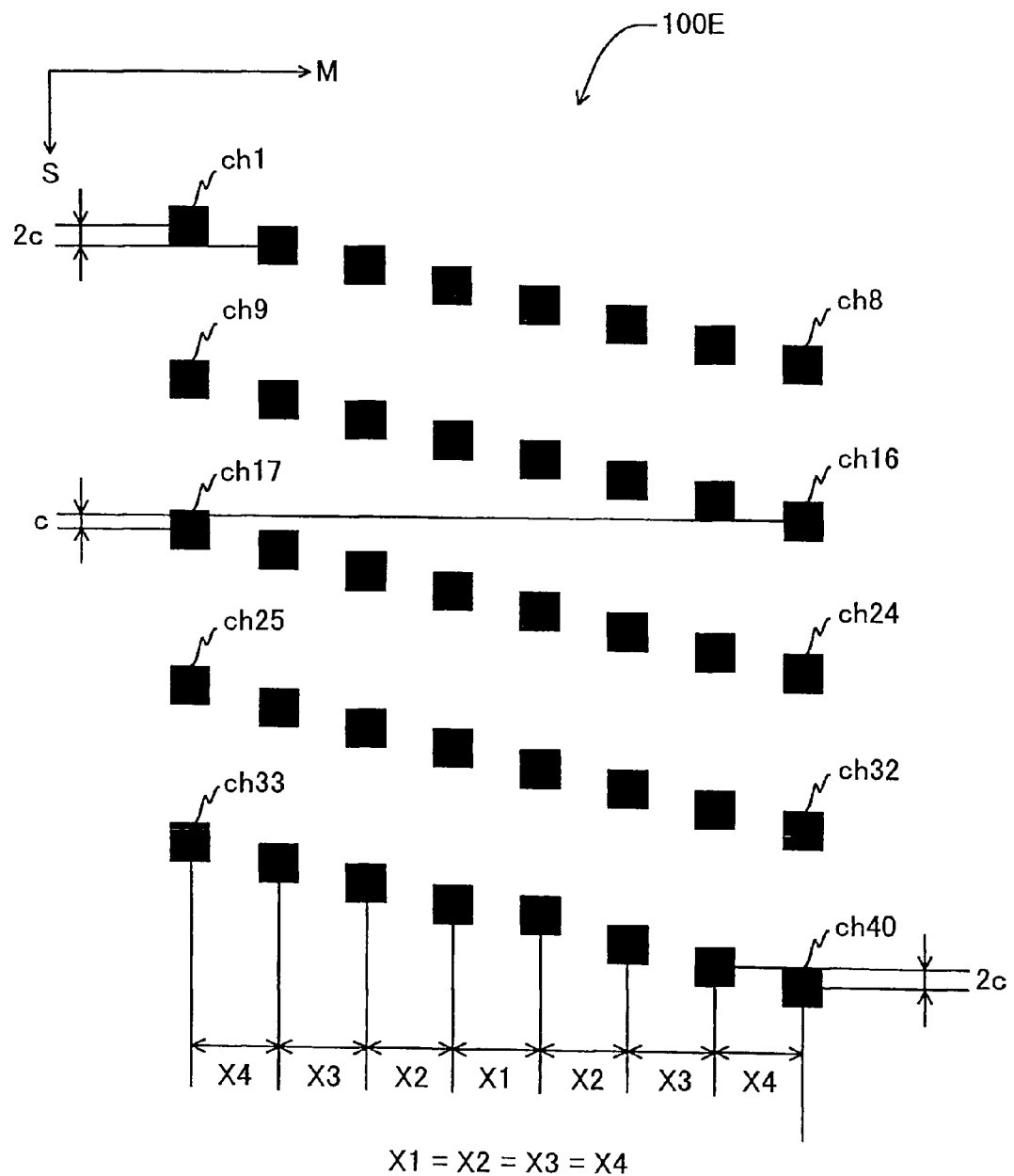
FIG. 18 is a diagram for explaining a modification of a surface-emitting laser array in an embodiment of the invention.

The above-mentioned embodiment may be modified such that a surface-emitting laser array 100E shown in FIG. 18 is used instead of the surface-emitting laser array 100.

As shown in FIG. 18, in this surface-emitting laser array 100E, the light emitting part ch1 is arranged at the uppermost position in the −S side direction and the leftmost position in the −M side direction, and the light emitting part ch40 is arranged at the lowermost position in the +S side direction and the rightmost position in the +M side direction.

Moreover, in the surface-emitting laser array 100E, when the 40 light emitting parts are orthogonally projected on the virtual line parallel to the direction of S, the light emitting parts ch1-ch16 have equal spacings 2c, respectively. Suppose that c denotes a predetermined value.

Moreover, the surface-emitting laser array 100E is arranged so that the spacing between the light emitting part ch16 and the light emitting part ch17 is equal to c, and the light emitting parts ch17-ch40 have equal spacings 2c, respectively. The respective spacings between two of the light emitting part rows of the surface-emitting laser array 100E in the direction of M are equal.

In the above-mentioned embodiments, the case in which the laser printer 1000 is the image forming device to which the invention is applied has been explained. However, the invention is not limited to these embodiments. The invention may be applied also to an image forming device including the optical scanning device 1010, which allows formation of a high-density image at high speed.

The invention may be applied to an image forming device which includes the optical scanning device 1010 and emits a laser beam directly to a printing medium (a recording sheet which colors by a laser beam).

The invention may be applied to an image forming device using a silver-salt film as an image carrier. In this case, a latent image is formed on a silver-salt film by optical scanning, and the latent image is visualized by performing the process equivalent to a developing process in the usual silver-salt photographic printing process.

The invention may be applied to a color image forming device which forms a multicolor image by using an optical scanning device adapted for a multicolor image, allows formation of a high-density image at high speed.

Figure 19:
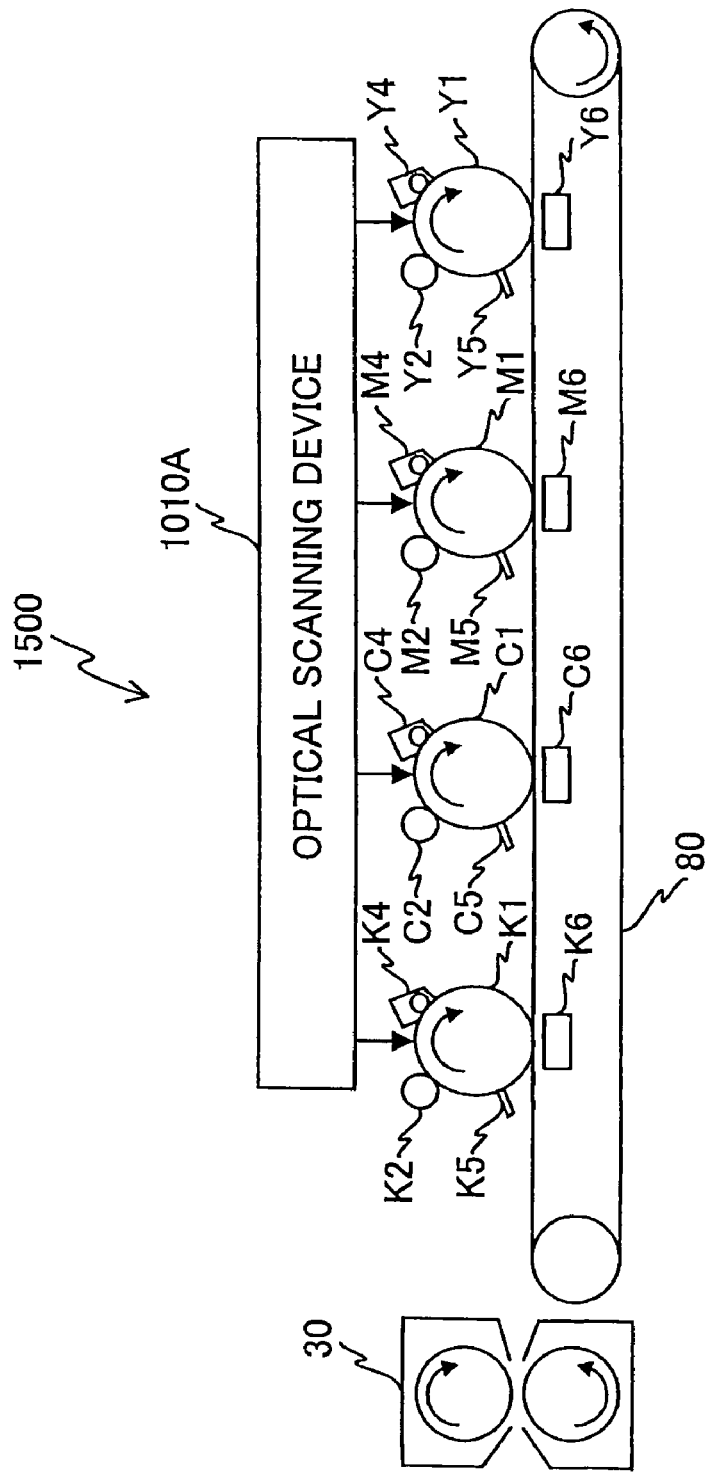
FIG. 19 is a diagram showing the composition of a tandem color image forming device in an embodiment of the invention.

For example, as shown in FIG. 19, the invention may be applied to a tandem color image forming device 1500 which includes a plurality of photoconductor drums adapted to form a color image.

This tandem color image forming device 1500 includes a black (K) photoconductor drum K1, an electric charger K2, a developing unit K4, a cleaning unit K5, a transfer electric charger K6, a cyan (C) photoconductor drum C1, a electric charger C2, a developing unit C4, a cleaning unit C5, a transfer electric charger C6, a magenta (M) photoconductor drum M1, an electric charger M2, a developing unit M4, a cleaning unit M5, a transfer electric charger M6, a yellow (Y) photoconductor drum Y1, an electric charger Y2, a developing unit Y4, a cleaning unit Y5, a transfer electric charger Y6, an optical scanning device 1010A, and a transfer belt 80, and a fixing unit 30.

The optical scanning device 1010A has a black surface-emitting laser array, a cyan surface-emitting laser array, a magenta surface-emitting laser array, and a yellow surface-emitting laser array.

The plurality of surface-emitting lasers, which are included in each surface-emitting laser array, have the two dimensional array which is essentially the same as that of one of the surface-emitting laser arrays 100-100E.

The light from the black surface-emitting laser array is directed to the black photoconductor drum K1 through the black scanning optical system. The light from the cyan surface-emitting laser array is directed to the cyan photoconductor drum C1 through the cyan scanning optical system. The light from the magenta surface-emitting laser array is directed to the magenta photoconductor drum M1 via the magenta scanning optical system. The light from the yellow surface-emitting laser array is directed to the yellow photoconductor drum Y1 through the yellow scanning optical system.

Each photoconductor drum is rotated in the direction indicated by the arrow in FIG. 19, and the electric charger, the developing unit, the transfer electric charger, and the cleaning unit are arranged around the periphery of each photoconductor drum in the direction of rotation, respectively.

Each electric charger uniformly charges the surface of a corresponding photoconductor drum. Each light ray from the optical scanning device 1010A is directed to the photoconductor drum surface charged by the electric charger, and an electrostatic latent image is formed on the photoconductor drum surface.

A toner image is formed on the photoconductor drum surface by the corresponding developing unit. The toner image of each color is transferred to a recording sheet via the transfer belt 80 by the corresponding transfer electric charger. Finally, the resulting color image is fixed to the recording paper by the fixing unit 30.

In a tandem color image forming device, a color deviation may arise due to manufacture errors, position errors, etc. of the respective component parts. The tandem color image forming device 1500 of this embodiment is arranged so that the optical scanning device 1010A includes the plurality of light emitting parts which are arranged in the two dimensional array according to the invention, and it is possible to raise the accuracy of compensation of a color deviation by selecting the light emitting parts that are turned on in a controlled manner.

The tandem color image forming device 1500 may be modified such that a black optical scanning device, a cyan optical scanning device, a magenta optical scanning device, and a yellow optical scanning device are used instead of the optical scanning device 1010A. It is adequate that each of these optical scanning devices in the modification is configured to include a surface-emitting laser array in which a plurality of surface-emitting lasers are arranged to have a two-dimensional arrangement that is essentially the same as that in any of the surface-emitting laser arrays 100-100E of the above-described embodiments.

Moreover, it is adequate that the image forming device in a modification is configured to include a surface-emitting laser array in which a plurality of surface-emitting lasers are arranged to have a two-dimensional arrangement that is essentially the same as that in any of the surface-emitting laser arrays 100-100E of the above-described embodiments, even if no optical scanning device is provided in the image forming device.

The present invention is not limited to the specifically disclosed embodiments, and variations and modifications may be made without departing from the scope of the present invention.

The present application is based on Japanese patent application No. 2007-184190, filed on Jul. 13, 2007, and Japanese patent application No. 2008-107363, filed on Apr. 17, 2008, the contents of which are incorporated herein by reference in their entirety.

The invention claimed is:

1. A surface-emitting laser array including a plurality of light emitting parts arranged in a two-dimensional formation having two orthogonal directions,
    wherein the plurality of light emitting parts are arranged in rows, each row including a subset of light emitting parts linearly arrayed along the row in a direction parallel to one of the two orthogonal directions, and the directions of the rows being parallel to each other,
    wherein, when the plurality of light emitting parts are orthogonally projected on a virtual line parallel to the one of the two orthogonal directions, a spacing between two of the plurality of light emitting parts along the virtual line is equal to an integral multiple of a predetermined value,
    wherein said plurality of light emitting parts orthogonally projected on the virtual line include a first light emitting part, a second light emitting part adjacent to the first light emitting part along the virtual line, and a third light emitting part adjacent to the second light emitting part along the virtual line, the first, second and third light emitting parts are located at a central position in the one of the two orthogonal directions, and a spacing between the first and second light emitting parts differs from a spacing between the second and third light emitting parts in the one of the two orthogonal directions.

2. The surface-emitting laser array of claim 1, wherein the second and third light emitting parts are located near end portions in the other direction of the two orthogonal directions, and the spacing between the second and third light emitting parts along the virtual line is smaller than the spacing between the first and second light emitting parts along the virtual line.

3. The surface-emitting laser array of claim 1, wherein a spacing between two of the plurality of light emitting parts located at a central portion of the two-dimensional array is larger in the one of the two orthogonal directions than a spacing between two of the plurality of light emitting parts located at an end portion of the two-dimensional array.

4. The surface-emitting laser array of claim 1, wherein a spacing between two of the plurality of light emitting parts located at a central portion of the two-dimensional array is larger in the other direction of the two orthogonal directions than a spacing between two of the plurality of light emitting parts located at an end portion of the two-dimensional array.

5. The surface-emitting laser array of claim 1, wherein the plurality of light emitting parts include a plurality of rows of light emitting parts, each row including at least two light emitting parts arranged in the one of the two orthogonal directions, are arranged in the other direction of the two orthogonal directions, and the number of the light emitting part rows is larger than the number of the light emitting parts contained in one light emitting part row.

6. The surface-emitting laser array of claim 1, wherein two light emitting parts located at ends of the two-dimensional array in the one of the two orthogonal directions are arranged at positions other than ends of the two-dimensional array in a direction perpendicular to the one of the two orthogonal directions.

7. An optical scanning device comprising:
    a light source unit including the surface-emitting laser array of claim 1, the light source unit having a main scanning direction and a sub-scanning direction parallel to the two orthogonal directions respectively;
    a deflection unit deflecting a plurality of laser beams emitted by the light source unit; and
    a scanning optical system focusing the laser beams output from the deflection unit on a scanned surface of a photoconductor.

8. An image forming device comprising the optical scanning device of claim 7 and a photoconductor, wherein the optical scanning device scans a surface of the photoconductor by laser beams output from the optical scanning device, so that an image is formed on the photoconductor surface in accordance with image information of the laser beams.

9. The image forming device of claim 8, wherein the image information is multicolor image information.

10. An image forming device comprising the surface-emitting laser array of claim 1, wherein the surface-emitting laser array is provided as a part of an optical writing unit, the optical writing unit outputting laser beams to a photoconductor when writing image information to the photoconductor.

11. The surface-emitting laser array of claim 1, wherein the plurality of light emitting parts are arranged in plural linear rows, and each row of the plural linear rows includes at least two light emitting parts and is disposed in a same specific direction of the two orthogonal directions, and the plural linear rows are spaced apart in a direction orthogonal to the specific direction.

12. The surface-emitting laser array of claim 1, wherein the plurality of light emitting parts are arranged in plural linear rows, and each row of the plural linear rows includes at least two light emitting parts and is parallel to each other and disposed in a specific direction selected from a sub-scanning direction and a direction orthogonal to the sub-scanning direction, and the plural linear rows are spaced apart in a direction orthogonal to the specific direction.

13. The surface-emitting laser array of claim 1, wherein the plurality of light emitting parts are arranged in plural linear rows, and each one of the plural linear rows contains a number of light emitting parts that is smaller than a number of said plural linear rows.

* * * * *